United States Patent
Segaram et al.

[11] Patent Number: 5,822,325
[45] Date of Patent: Oct. 13, 1998

[54] INTEGRATED TWISTED PAIR FILTER WITH A SECURE RIC FUNCTION

[75] Inventors: Para K. Segaram, Campbell; Roy T. Myers, Jr., Santa Clara, both of Calif.

[73] Assignee: National Semiconductor Corporation, Santa Clara, Calif.

[21] Appl. No.: 500,298

[22] Filed: Jul. 10, 1995

[51] Int. Cl.[6] .................................................. H04J 3/08
[52] U.S. Cl. .............................................................. 370/501
[58] Field of Search ........................ 395/200.02; 370/445, 370/501

[56] References Cited

U.S. PATENT DOCUMENTS

| | | | |
|---|---|---|---|
| 4,847,831 | 7/1989 | Spiesman et al. | 370/501 |
| 5,293,375 | 3/1994 | Moorwood et al. | 370/445 |
| 5,357,145 | 10/1994 | Segaram | 327/361 |
| 5,361,261 | 11/1994 | Edem et al. | 370/445 |
| 5,410,188 | 4/1995 | Segaram | 327/237 |
| 5,432,907 | 7/1995 | Picazo et al. | 395/200.79 |

*Primary Examiner*—Parshotam S. Lall
*Assistant Examiner*—Kenneth R. Coulter
*Attorney, Agent, or Firm*—Skjerven, Morrill, MacPherson, Franklin & Friel LLP; Edward C. Kwok

[57] ABSTRACT

A repeater interface controller ("RIC") integrated circuit with integrated filters and buffer drivers is provided for use in a repeater. In one embodiment, the RIC uses two filters to filter link pulse signals and data signals for a plurality of ports. Thus, the RIC is able to concurrently provide filtered link pulses to some ports and filtered data signals to other ports. Further, because only two filters are used, the area required to implement the plurality of ports is reduced relative to conventional repeaters that use a filter for each port. In another embodiment of the present invention, a RIC includes a logic circuit and a plurality of analog multiplexers and twisted pair buffer drivers. The analog multiplexers receive signals on their input lines and select which of these signals are passed to the buffer drivers to be outputted. The logic circuit provides control signals to the analog multiplexers such that the analog multiplexers select a new input line when the signal on the new input line is approximately the same as the signal on the currently selected input line. As a result, the signal passed on to the buffer drivers remains approximately the same, thereby reducing switching noise.

14 Claims, 8 Drawing Sheets

INTEGRATED TWISTED PAIR FILTER WITH A SECURE RIC FUNCTION

FIELD OF THE INVENTION

The present invention relates to local area networks and, in particular, to repeater interface controller circuits for use in local area networks.

BACKGROUND

The term "local area network" or LAN, generally refers a communications system that provides interconnection among a number of independent computing stations within a small area. This small area is typically a single building or set of closely grouped buildings.

Some of the standards or protocols for implementing a LAN require a medium attachment unit ("MAU") that couples the computing station to the physical medium implementing the interconnection. These standards typically require an attachment unit interface ("AUI") for coupling the computing station or twisted pair interface ("TPI") to the associated MAU.

A "repeater" can be used to couple together a number of nodes or hubs to extend the size of a LAN. The repeater typically includes at least one MAU for each node or hub coupled to the repeater so that signals can be passed to and from a node or hub to any other node or hub coupled to the repeater. Typically, the repeater synchronizes, amplifies and regenerates the signals as the signals are passed through to reduce data corruption.

For example, the 10BASE-T Ethernet standard uses twisted pair wiring to provide the interconnection between computing stations, with separate transmit and receive circuits. The 10BASE-T Ethernet standard is herein incorporated by reference in its entirety. Some conventional twisted pair repeaters use external filters and buffer drivers to transmit signals on each twisted pair. Because a repeater can have several MAUs (i.e., ports to several nodes or hubs), a filter and buffer driver is needed for each port, thereby increasing the repeater's size and cost. The external filters and drivers also generate a significant amount of electromagnetic interference ("EMI").

The 10BASE-T Ethernet standard also requires each MAU in the LAN to transmit a series of "link pulses" to confirm that the MAU is properly connected. Because each repeater has one or more MAUs, each repeater must generate link pulses between signals (i.e., data) retransmitted or received on each MAU's associated twisted pair interconnect wiring. In addition, the 10BASE-T Ethernet standard provides for data transmission in "packets" that include destination address, source address, type/length field, and a data field.

SUMMARY

According to the present invention, a repeater interface controller ("RIC") integrated circuit with integrated filters and buffer drivers is provided for use in a repeater.

In one embodiment, the RIC uses two filters to filter link pulses and a data signal for a plurality of ports. The term "signal" is used in this context to mean a serial data stream Thus, the RIC is able to concurrently provide a filtered link pulse to some ports and a filtered data signal to other ports. Further, because only two filters are used, the area required to implement the plurality of ports is reduced relative to conventional repeaters that use a filter for each port. As a result, integration of the filters and buffer drivers onto the RIC integrated circuit is made more practical, thereby reducing size, cost and EMI radiation.

In another embodiment, the RIC uses three filters to filter link pulses, a Manchester encoded transmit data signal and a security data signal for twelve ports. Thus, the RIC is able to concurrently provide a filtered link pulse to some ports, a filtered Manchester encoded transmit data signal to other ports and a filtered security data signal to still other ports. Further, because only three filters are used, the area required to implement the plurality of ports is reduced relative to conventional repeaters, thereby making more practical the integration of the filters and buffer drivers. Accordingly, data security is provided and the size, cost and EMI radiation of the repeater is greatly reduced.

In another embodiment of the present invention, a RIC includes a logic circuit and a plurality of analog multiplexers and twisted pair buffer drivers. The analog multiplexers receive signals on their input lines and select which of these signals are passed to the buffer drivers to be outputted. The logic circuit provides control signals to the analog multiplexers such that the analog multiplexers select a new input line when the signal on the new input line is approximately the same as the signal on the currently selected input line. As a result, the signal passed on to the buffer drivers remains approximately the same, thereby preventing the switching noise, reflections and ground bounce that could be generated if the signals were not approximately the same.

DETAILED DESCRIPTION

Figure 1:
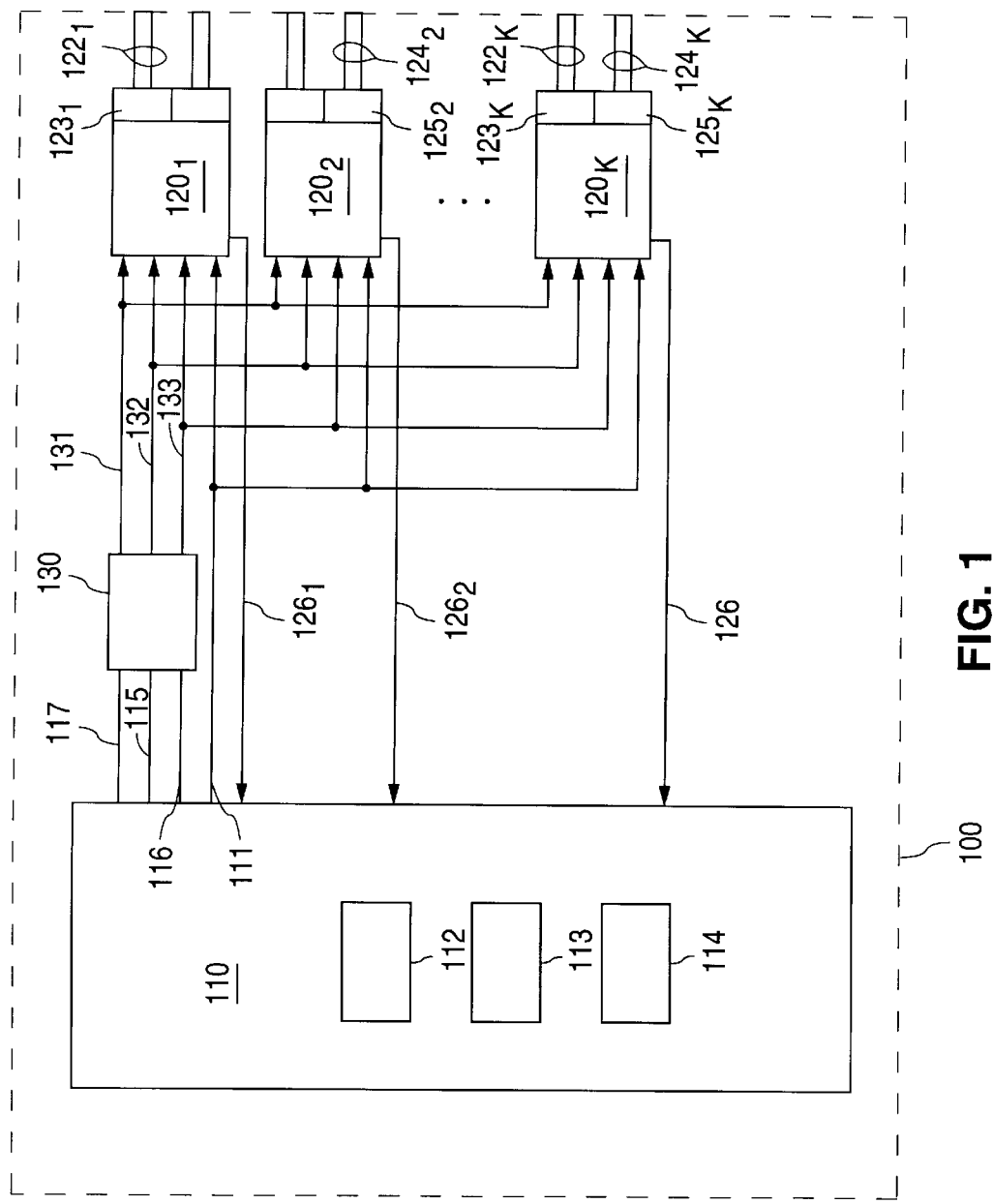
FIG. 1 shows a simplified block diagram of the architecture of a RIC according to one embodiment of the present invention.

FIG. 1 shows the architecture of a RIC 100 according to one embodiment of the present invention. RIC 100 includes a timing and control circuit ("TCC") 110. In one embodiment, TCC 110 includes circuitry substantially similar to circuitry disclosed in application, "REPEATER INTERFACE CONTROLLER HAVING SECURITY FEATURES", application Ser. No. 08/023,991, now abandoned filed Feb. 26, 1993 by Charan Jeet Singh, et al (referred to hereinafter as the Singh application). The Singh application is assigned to the same assignee as the present application and herein incorporated by reference in its entirety.

TCC 110 provides control signals to control the operation of port blocks 120$_1$, 120$_2$, . . . 120$_K$ via line 111. TCC 110 includes a main state machine ("MSM") 112, an elasticity buffer 113 and address filters 114 to provide these control signals. MSM 112, elasticity buffer 113 and address filters 114 are disclosed in the aforementioned Singh application.

In addition, TCC 110 provides transmit data ("txib") and random data ("randenc") to a data generation and filter circuit 130 via lines 115 and 116, respectively. Data generation and filter circuit 130 is described further below in conjunction with FIG. 2.

TCC 110 also provides control signals via line 117 to data generation and filter circuit 130. The control signals provided by TCC 110 to data generation and filter circuit 130 include the following signals listed in Table 1 below.

TABLE 1

| Signal | Description | Source |
| --- | --- | --- |
| txeg | global transmit: asserted when MSM has entered the transmit state | MSM |
| x1 | 20 MHz clock | external oscillator |
| grst | global reset: asserted when power is restored | Power On reset circuit |
| eotyplf | end of type length field: asserted after the type length field has been posted | Packet monitor in TCC |
| every4ms | 4ms clock (250 KHz) | 4 ms timer |
| txmsm | early global transmit: asserted slightly before txeg | MSM |
| dmvalid | destination match valid: asserted when address filters finish comparing destination address | address filters |

Data generation and filter circuit 130 provides the link pulse ("link"), a Manchester encoded transmit data ("txdata") signal and a random Manchester encoded data ("random") signal to port blocks 120$_1$, 120$_2$, . . . 120$_K$ via lines 131–133, respectively. The random data signal is used to implement a security feature that corrupts transmit data destined for an unauthorized port or generated by an unauthorized source coupled to RIC 100 (FIG. 1). The security feature, the txdata signal and the random data signal are disclosed in the aforementioned Singh application.

Port blocks 120$_1$, 120$_2$, . . . 120$_K$ are respectively coupled to transmit twisted-pairs 122$_1$ . . . 122$_K$ via transmit blocks 123$_1$ . . . 123$_K$. RIC 100 transmits the txdata to computing stations coupled to the ports using transmit blocks 123$_1$ . . . 123$_K$. The transmit blocks are described further below in conjunction with FIG. 2.

Port blocks 120$_1$, 120$_2$, . . . 120$_K$ are respectively coupled to receive twisted-pairs 124$_1$ . . . 124$_K$ via receive blocks 125$_1$ . . . 125$_N$. RIC 100 uses the receive blocks to receive data from computing stations coupled to the ports. Port blocks 120$_1$, 120$_2$, . . . 120$_K$ provide receive data respectively received from receive twisted-pairs 124$_1$ . . . 124$_K$ to TCC 110 via receive data lines 126$_1$ . . . 126$_K$. The receive blocks are fully disclosed in the aforementioned Singh application.

Figure 2:
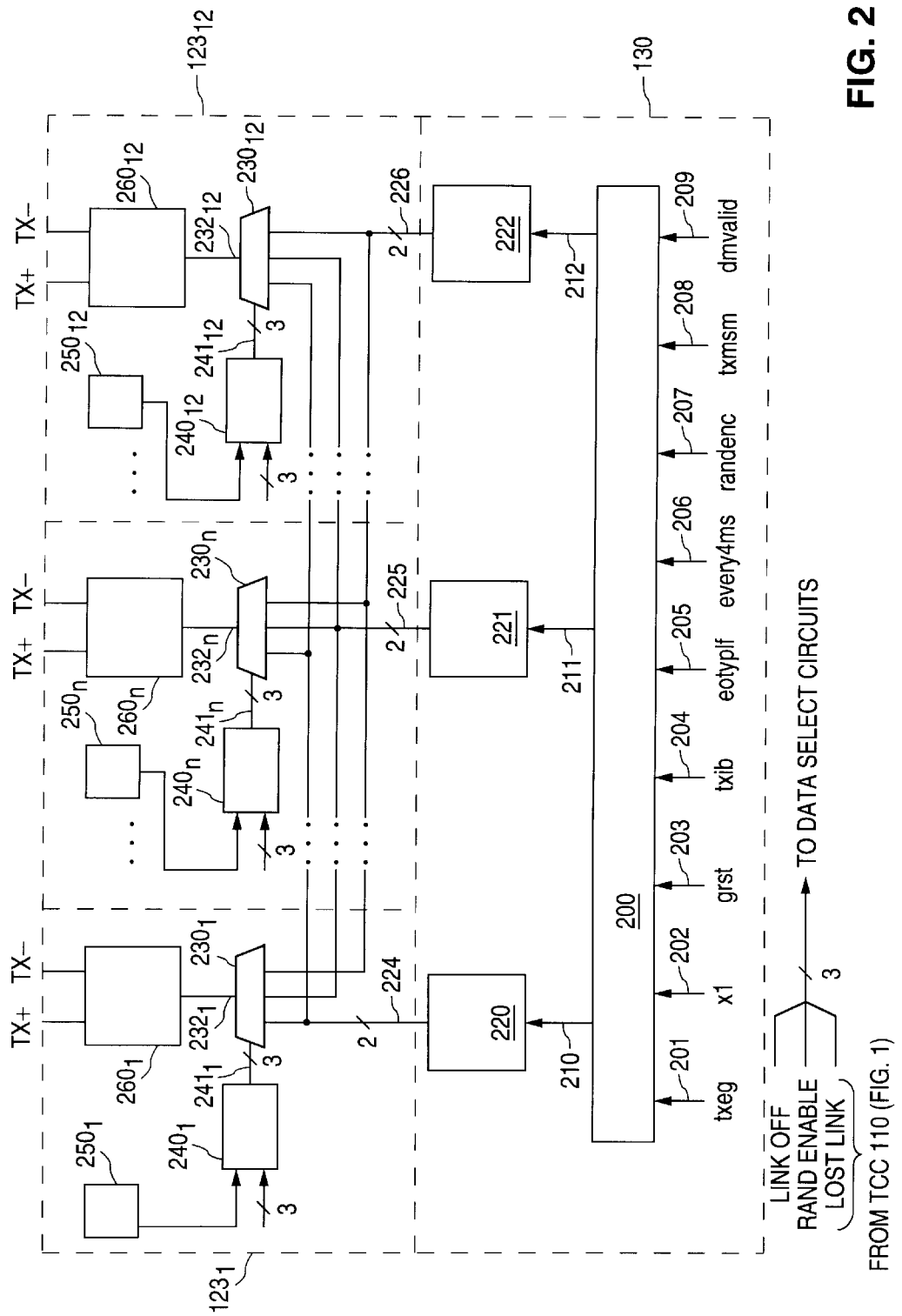
FIG. 2 shows a block diagram of a transmit block of a port of a RIC according to one embodiment of the present invention.

FIG. 2 shows a block diagram of one embodiment the transmit architecture of RIC 100 (FIG. 1). In this embodiment, RIC 100 has twelve ports. Common reference numerals are used between drawings for elements having substantially similar structure and function.

Data generation and filter block 130 includes a data generation circuit 200 having input leads 201–209 coupled to TCC 110 (not shown). As shown in FIG. 2, data generation circuit 200 provides the link signal, the txdata signal and the random signal on lines 210–212, respectively in response to signals transmitted by TCC 110 on input leads 201–209. Data generation circuit 200 is described further below in conjunction with FIG. 4.

Filters 220–222 are respectively coupled to data generation circuit 200 via lines 210–212. As a result, filter 220 filters the link pulses, filter 221 filters the txdata signal, and filter 222 filters the random signal. Filters 220–222 can be implemented using a low-pass filter or other wave shaping circuit. For example, a conventional low-pass L-C filter can be used. In another embodiment, filters 220–222 are substantially similar to wave shaping circuits and PLL disclosed in U.S. Pat. No. 5,357,145 ("the '145 patent") issued to Para K. Segaram on Oct. 18, 1994 and assigned to the same assignee as the present invention. The '145 patent is herein incorporated by reference in its entirety. Of course, other types of filters and circuits can be used to shape the output waveform on the twisted-pair lines.

The output leads 224–226 of filters 220–222 are each coupled to transmit blocks 123$_1$ . . . 123$_{12}$. Transmit blocks 123$_1$ . . . 123$_{12}$ include analog multiplexers 230$_1$ . . . 230$_{12}$ which are each coupled to output leads 224–226, thereby receiving the filtered link pulses, txdata signal and random signal.

Transmit blocks 123$_1$, . . . 123$_{12}$ also include data select circuits 240$_1$ . . . 240$_{12}$, respectively. Data select circuits 240$_1$ . . . 240$_{12}$ respectively provide control signals to analog multiplexers 230$_1$ . . . 230$_{12}$ via lines 241$_1$ . . . 241$_{12}$, to select one of the three signals (i.e., the filtered link pulses, the filtered txdata signal or the filtered random signal) to output on lines 232$_1$ . . . 232$_{12}$, respectively. Each data select circuit provides a random select signal, a transmit select signal and a link select signal to control its associated analog multiplexer in selecting which signal to output (described further below in conjunction with FIG. 7).

Data select circuits 240$_1$ . . . 240$_{12}$ are respectively coupled to the per port TXEL state machines 250$_1$ . . . 250$_{12}$. Each TXEL state machine provides a local transmit enable ("txel") signal to its associated data select circuit. Data select circuits 240$_1$ . . . 240$_{12}$ each also receives control signals from TCC 110 (FIG. 1). These signals are the link off, randenable and lost link signals. The random select, transmit select and link select signals are asserted according to the following logic equations:

random select=txel×randenable×!lost link            (1)

transmit select=txel×!randenable×!lost link         (2)

link select=(lost link×!link off)+!(txel+link off)  (3)

Figure 2A:
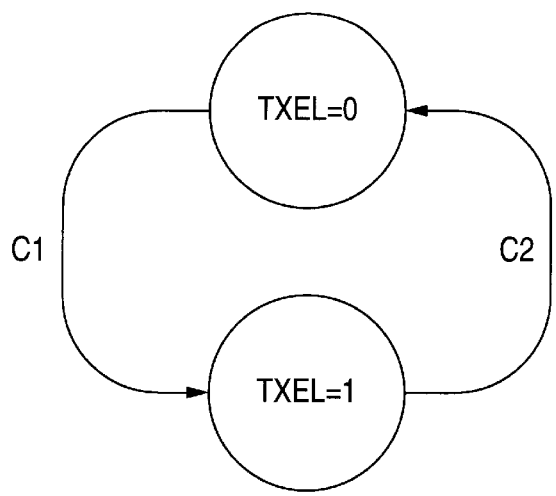
FIG. 2A shows a state diagram illustrating a TXEL state machine.

FIG. 2A shows the state diagram of the TXEL state machine. The TXEL state machine receives control signals from TCC 110 (FIG. 1). The state transition terms for the TXEL state diagram (FIG. 2A) are:

C1=minterm1 or minterm2

C2=minterm3 or minterm4 or minterm5 where, the minterms for the TXEL state diagram are as follows.

Minterm1: TXEG and NOT DISPT and NOT M and NOT ANYXNSIz there is a current transmission this port is not disabled this port's N state machine is in the idle state there is no transmit collision Minterm2: TXEG and NOT DISPT and JAM1 and ANYX-NSIz there is a current transmission this port is not disabled the current preamble bit is a 1 there is a transmit collision Minterm3: NOT TXEG there is no longer a transmission Minterm4: DISPT this port is disabled Minterm5: M and NOT ANYXNSIz and ENDz this port's N state machine is in either port N or port M state there is no transmit collision are at the end of the current bit Referring back to FIG. 2, transmit port blocks $123_1 \ldots 123_{12}$ include buffer drivers $260_1 \ldots 260_{12}$. Buffer drivers $260_1 \ldots 260_{12}$ are respectively coupled to analog multiplexers $230_1 \ldots 230_{12}$ via lines $232_1 \ldots 232_{12}$. Buffer drivers $260_1 \ldots 260_{12}$ receive the signal selected by analog multiplexers $230_1 \ldots 230_{12}$, respectively and output the selected signals on the twisted-pair lines.

In operation, data generation circuit 200 provides link signals approximately every 16 ms on line 210. Filter 220 filters the link signal and provides true and complement filtered link signals to analog multiplexers $230_1 \ldots 230_{12}$ via line 224. An analog multiplexer only selects the filtered link pulses when that particular analog multiplexer is part of "PortN". As disclosed in the aforementioned Singh application, PortN is the port that received the data being transmitted to the rest of the ports. PortN does not retransmit the received data.

TCC 110 (FIG. 1) also provides signals to each port transmit block to be used by each port transmit block to determine whether that transmit block will transmit either txdata or random data. If a link is lost on a port, the port will only output link pulses (see logic equation 3 above).

In addition, because PortN does not retransmit txdata or random data, the data select circuit for PortN causes its associated analog multiplexer to continue to output the filtered link pulses to that port's buffer driver. The buffer driver then outputs the filtered link pulses onto its associated twisted-pair line.

When a transmit port block determines that it is going to output the txdata signal, the flow is as follows. Data generation circuit 200 provides the txdata signal to filter 221 via line 211. Filter 221 filters the txdata signal and provides true and complement filtered txdata signals to analog multiplexers $230_1 \ldots 230_{12}$ via line 225. The data select circuit for each port that has determined it will output the txdata signal causes the analog multiplexer for that port to output the filtered true and complement txdata signals to that port's buffer drivers. The buffer drivers then output the filtered true and complement txdata signal onto its associated twisted-pair line.

However, if one or more ports are not authorized destinations for the txdata, then, through the security feature (disclosed in the aforementioned Singh application), the port associated with each of the unauthorized destination ports controls its corresponding analog multiplexer to select the random data instead.

The flow for this scenario is as follows. Data generation circuit 200 provides the random signal to filter 222 via line 212. Filter 222 filters the random signal and provides true and complement filtered random signals to analog multiplexers $230_1 \ldots 230_{12}$ via line 226. The data select circuit for each invalid destination port causes the analog multiplexer for that port to output the filtered true and complement random signals to the port's buffer drivers. The buffer drivers then output the filtered true and complement random signals onto its associated twisted-pair line.

Typically, the same txdata is transmitted by the authorized ports and the same random data is transmitted by the unauthorized ports. Thus, only three filters are needed to filter the link, txdata and random data signals. The present invention takes advantage of this fact to reduce the number of filters relative to conventional RICs (which typically use an external filter for every port) thereby reducing the RIC's size and cost. Further, the reduced number of filters allows the filters and buffer drivers to be integrated with the RIC, thereby reducing EMI and further reducing size and cost.

Figure 3:
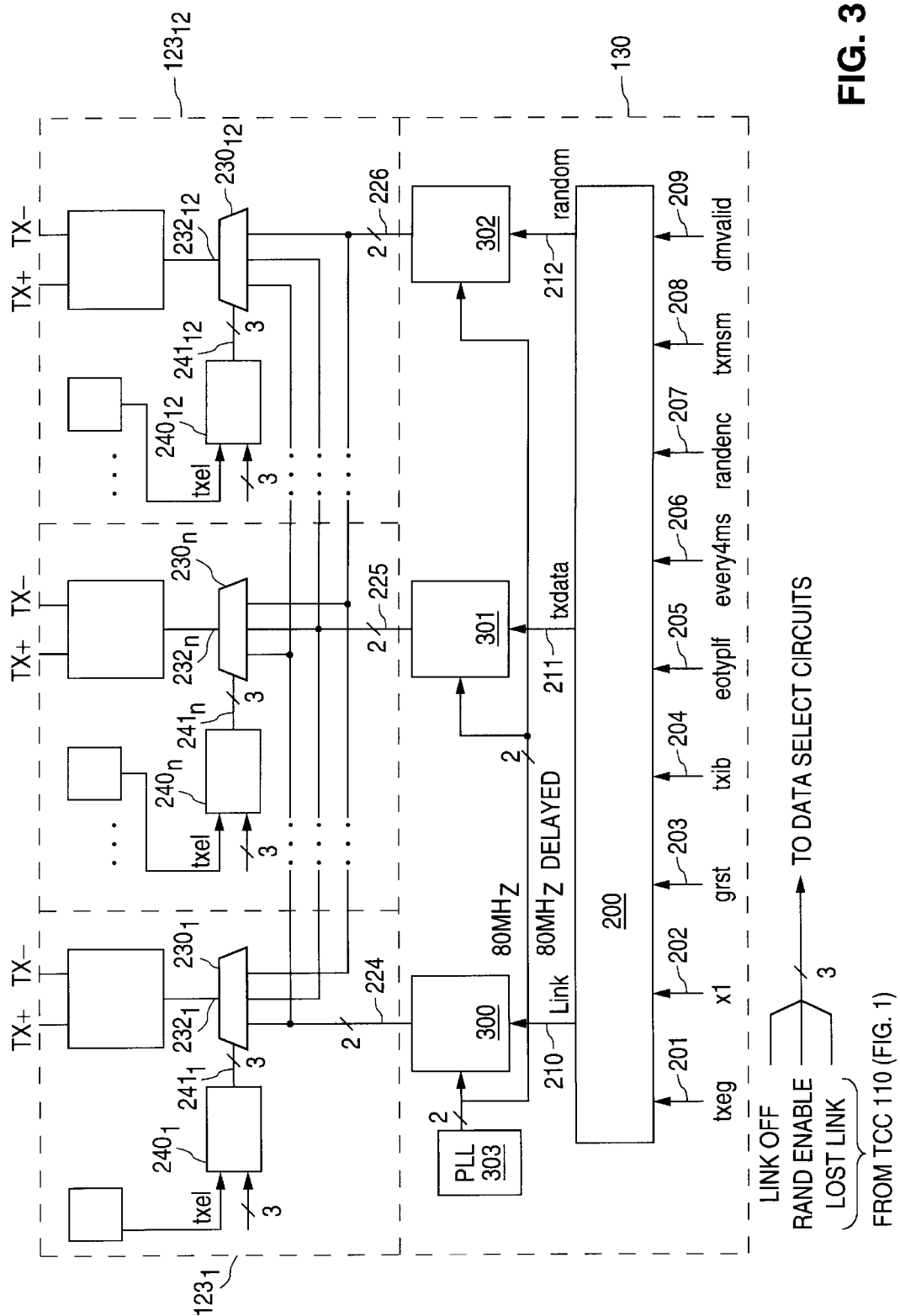
FIG. 3 shows a block diagram of another embodiment of a transmit block according to the present invention.

FIG. 3 shows a block diagram of another embodiment of data generation and filter circuit 130 and transmit blocks $123_1 \ldots 123_N$ of port blocks $120_1 \ldots 120_K$ of RIC 100 (FIG. 1) according to the present invention for use with a 10BASE-T Ethernet repeater. This embodiment is substantially similar to the embodiment of FIG. 2, except that filters 220–222 are replaced with wave shaping circuits 300–302 and phase-locked loop ("PLL") 303. Wave shaping circuits 300–302 and PLL 303 are substantially similar to the wave shaping circuits disclosed in U.S. Pat. No. 5,410,188 entitled "Enhanced Integrated Waveshaping Circuit" ("the '188 patent") issued to Para K. Segaram on Apr. 25, 1995 and assigned to the same assignee as the present invention. The '188 patent is herein incorporated by reference in its entirety. This embodiment operates in substantially the same manner as the embodiment of FIG. 2, except for the operation of PLL 303.

Figure 4:
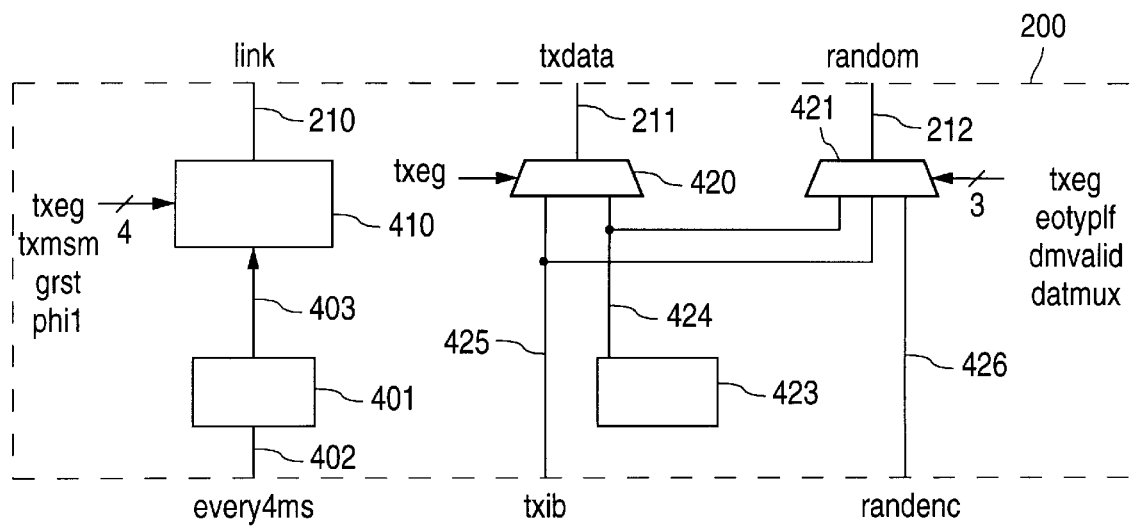
FIG. 4 shows a conceptual block diagram of one embodiment of data generation circuit 200 depicted in the transmit block depicted in FIG. 3.

FIG. 4 shows a conceptual block diagram of one embodiment of data generation circuit 200 (FIG. 3). Data generation circuit 200 includes a timer 401 which receives a signal every 4 ms via a line 402. Signal every 4 ms is a clock signal having a period of 4 ms. Timer 401 counts the clock periods of signal every 4 ms and outputs a clock signal having a period of approximately 16 ms on a line 403.

A link generator 410 is coupled to line 403, thereby receiving the 16 ms clock signal. Link generator 410 also receives the global transmit ("txeg") and early global transmit ("txmsm") signals from TCC 110 (FIG. 1). The txmsm and txeg signals provide a window before the start of a packet ("SOP"). Link generator 410 will not generate a link signal during this SOP window, but will delay any link pulse generated during this SOP window until after the window has ended. Thus, link generator 410 ensures that link generator 410 provides link pulses within the time requirements of the 10BASE-T Ethernet standard.

As described below in conjunction with FIG. 6, non-portal ports switching for transitions from txdata to link is done during idle. As a result, switching noise is substantially eliminated for transitions between link and txdata for non-portN ports.

When switching from link to txdata, TCC 110 causes the analog multiplexer to select the txdata path only when both link and txdata are at idle. Thus, the voltages on lines 210 and 211 are approximately equal, thereby reducing switching noise.

Data generation circuit 200 also includes multiplexer circuits 420 and 421 and end of packet/idle ("EOP/idle") generator 423. EOP/idle generator 423 provides EOP and idle signals as specified in the 10BASE-T Ethernet standard to indicate the end of a packet and to place the port in the idle state, respectively. EOP/idle generator 423 generates an idle signal after generating the EOP signal. Multiplexer circuits 420 and 421 receive the EOP and idle signals generated by EOP/idle generator 423 via line 424.

Both multiplexer circuits 420 and 421 receive the txib data signals from TCC 110 (FIG. 1) via a line 425. Multiplexer circuit 420 also receives the txeg signal. The txeg signal, when asserted, causes multiplexer circuit 420 to select the txib data signals from TCC 110. After the packet of txib data signals is transmitted, the txeg signal is deasserted, thereby causing multiplexer circuit 420 to select the EOP and idle signals from EOP/idle generator 423.

Multiplexer circuit 421 operates in a similar manner, except multiplexer circuit 421 switches between the randenc data signal, the txib data signal and the EOP and idle signals. Multiplexer circuit 421 selects the randenc signal after the destination address is transmitted. Signals txeg, end of type length field ("eotyplf") and destination match valid ("dmvalid") control the switching of multiplexer circuit 421.

In addition, multiplexer circuit 421 receives the txib data signals from TCC 110. Multiplexer circuit 421 selects txib data before SOP so that the voltages provided on the random and txdata lines match. Consequently, txdata is transmitted on line 212 after SOP.

In normal operation, RIC 100 transmits the destination address (from the txib data) even when the destination address is unauthorized. The selection of txib by multiplexer circuit 421 at SOP allows the analog multiplexer (FIG. 3) of the transmit port corresponding to the unauthorized destination address to switch from txdata to random without causing additional noise at the analog multiplexer. Then multiplexer circuit 421 selects the randenc signal after the destination address has been transmitted. Consequently, when the analog multiplexer corresponding to this "unauthorized" port selects the random data signals, there is substantially no voltage mismatch when switching from txdata to random. As a result, this two-tier switching scheme substantially eliminates switching noise in the unauthorized destination address scenario.

However, when the source address is unauthorized, RIC 100 (FIG. 1) must provide random data to every transmit port block. In this embodiment, TCC 110 then provides randomized data in the txib path (i.e., line 426). Thus, all of the analog multiplexers (FIG. 3) continue to select the txdata, thereby substantially eliminating switching noise in the unauthorized source address scenario.

Figure 5:
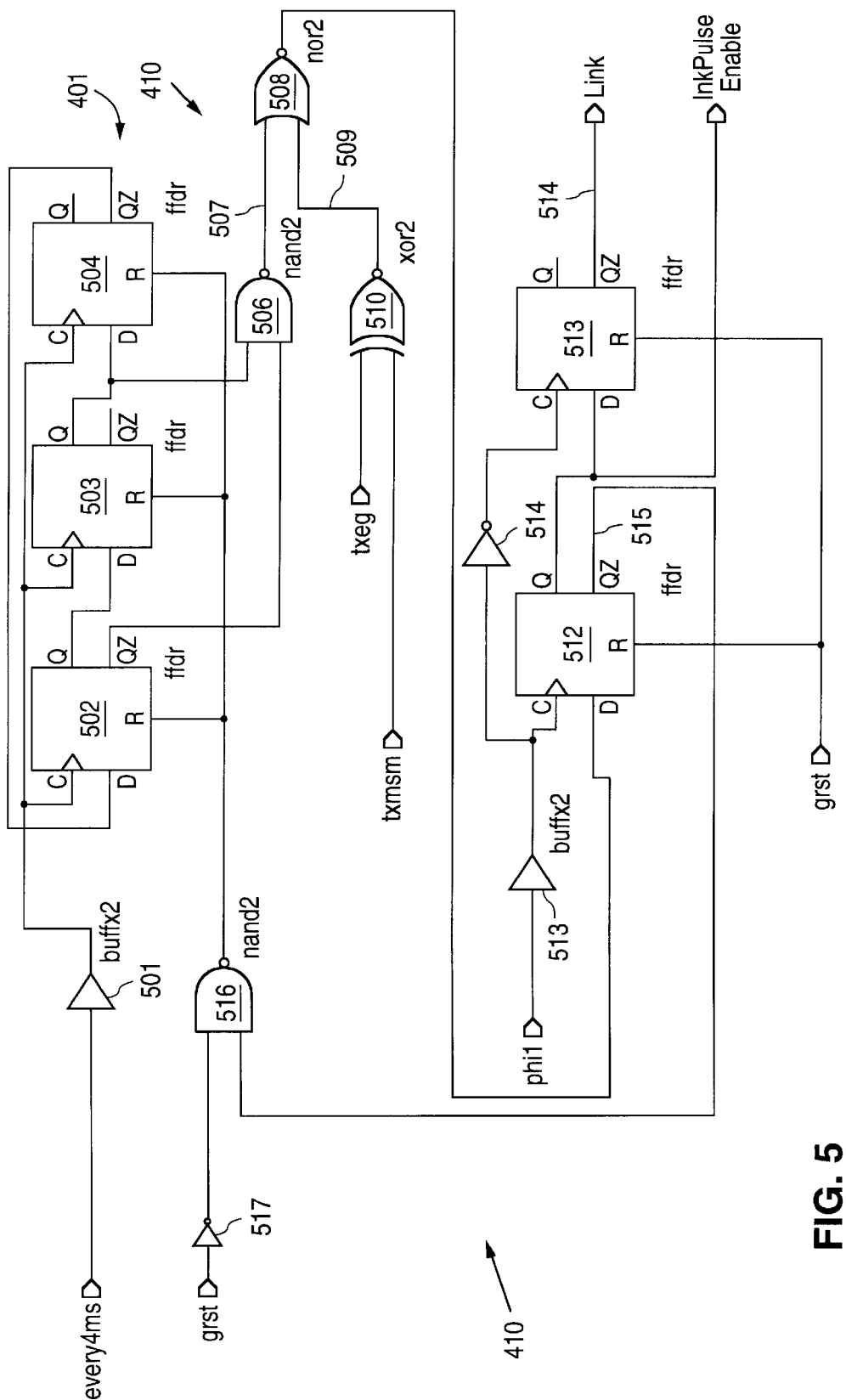
FIG. 5 shows a schematic diagram of one embodiment of the link generator of data generation circuit depicted in FIG. 4.

FIG. 5 shows a schematic diagram of one embodiment of timer 401 and link generator 410 (FIG. 4). Timer 401 includes a buffer 501 and D flip flops 502–504. Buffer 501 receives signal every 4 ms and drives the clock input nodes of D flip flops 502–504. D flip flops 502–504 are connected to form a ring counter providing a clock signal having a 16 ms period.

Link generator 410 includes a two-input NAND gate 506. NAND gate 506 has an input lead coupled to the Q output lead of D flip flop 503 and the QZ output lead of D flip flop 502. Thus, NAND gate 506 outputs a "negative" pulse every 16 ms on output lead 507.

Link generator 410 also includes a two-input NOR gate 508, which has one input lead coupled to output lead 507 of NAND gate 506. The other input lead 509 of NOR gate 508 is normally at a logic low level (described below), thereby causing NOR gate 508 to operate as an inverter. Thus, the negative pulse generated by NAND gate 506 is normally inverted by NOR gate 508, except when the voltage at input load 509 is at a logic high level as described below. Thus, NOR gate 508 normally outputs a positive pulse every 16 ms.

Input lead 509 of NOR gate 508 is coupled to the output lead of an XOR gate 510. XOR gate 510 receives the txeg and txmsm signals. Thus, XOR gate outputs a logic high signal only when the txeg and txmsm signals are not the same. As stated above, the txmsm signal is substantially similar to the txeg signal except that the txmsm signal leads the txeg signal. Thus, the txeg and txmsm signals are unequal only during the window before the txeg signal is asserted (and deasserted). Accordingly, XOR gate 509 outputs a logic high signal during a "pre-SOP" and a "post-EOP" window. As a result, NOR gate 508 outputs a positive pulse every 16 ms, except during the pre-SOP and post-EOP windows, thereby substantially eliminating conflict with the SOP or the EOP.

Link generator 410 also includes a D flip flop 512. The output lead of NOR gate 508 is coupled to the D input lead of D flip flop 512. D flip flop 512 is clocked by signal phi1 received via a buffer 513. Signal phi1 is a 10 MHz clock signal. Thus, the output signal provided by NOR gate 508 is clocked into D flip flop 512. Further, NAND gate 506 will provide a pulse having a pulsewidth of up to 4 ms. Because a window is much less than 4 ms, NOR gate 508 will provide a logic high signal to D flip flop 512 even if the pulse from NAND gate 506 occurs during a pre-SOP window. Thus, D flip flop 512 will provide a logic high signal, which is used to generate a link pulse. Consequently, NOR gate 508 helps delay the link pulse until after the pre-SOP window.

The Q output lead of D flip flop 512 is coupled to the D input lead of a D flip flop 513. An inverter 514, having its input lead coupled to the clock input of D flip flop 512, clocks D flip flop 513 with the complement of signal phi1. Thus, the output signal of D flip flop 512 is clocked into D flip flop 513 a half a cycle (of signal phi1) after being clocked into D flip flop 512. The QZ output lead 514 of D flip flop 513 provides the link signal.

The QZ output lead 515 of D flip flop 512 is coupled an input lead of two-input NAND gate 516. Output lead 515 is normally at a logic high level until D flip flop receives a logic high signal at its D input node. The other input lead of NAND gate 516 is coupled to receive the complement of the global reset ("grst") signal via an inverter 517. The grst signal is used in the global reset mode, which does not form a substantial part of the present invention, but is included for completeness.

The output lead of NAND gate 516 is coupled to the reset nodes of D flip flops 502–504. The grst signal is at a logic low level when RIC 100 (FIG. 1) is not being reset. Thus, NAND gate 515 normally receives at logic high signal from inverter 516. Further, D flip flop 512 provides a logic high signal via its QZ output lead 515 when NOR gate 508 is not outputting a pulse. Thus, NAND gate 516 normally outputs a logic low signal, which does not reset D flip flops 502–504.

However, when a positive pulse from NOR gate 508 is clocked into D flip flop 512, D flip flop 512 provides a logic low signal to NAND gate 516, thereby resetting D flip flops 502–504. Consequently, D flip flop 512 outputs on its Q output lead a pulse having a pulse width approximately equal to the period of signal phi1. Further, the ring counter formed by D flip flops 502–504 begins a new cycle to generate a link pulse 16 ms later.

Figure 6A:
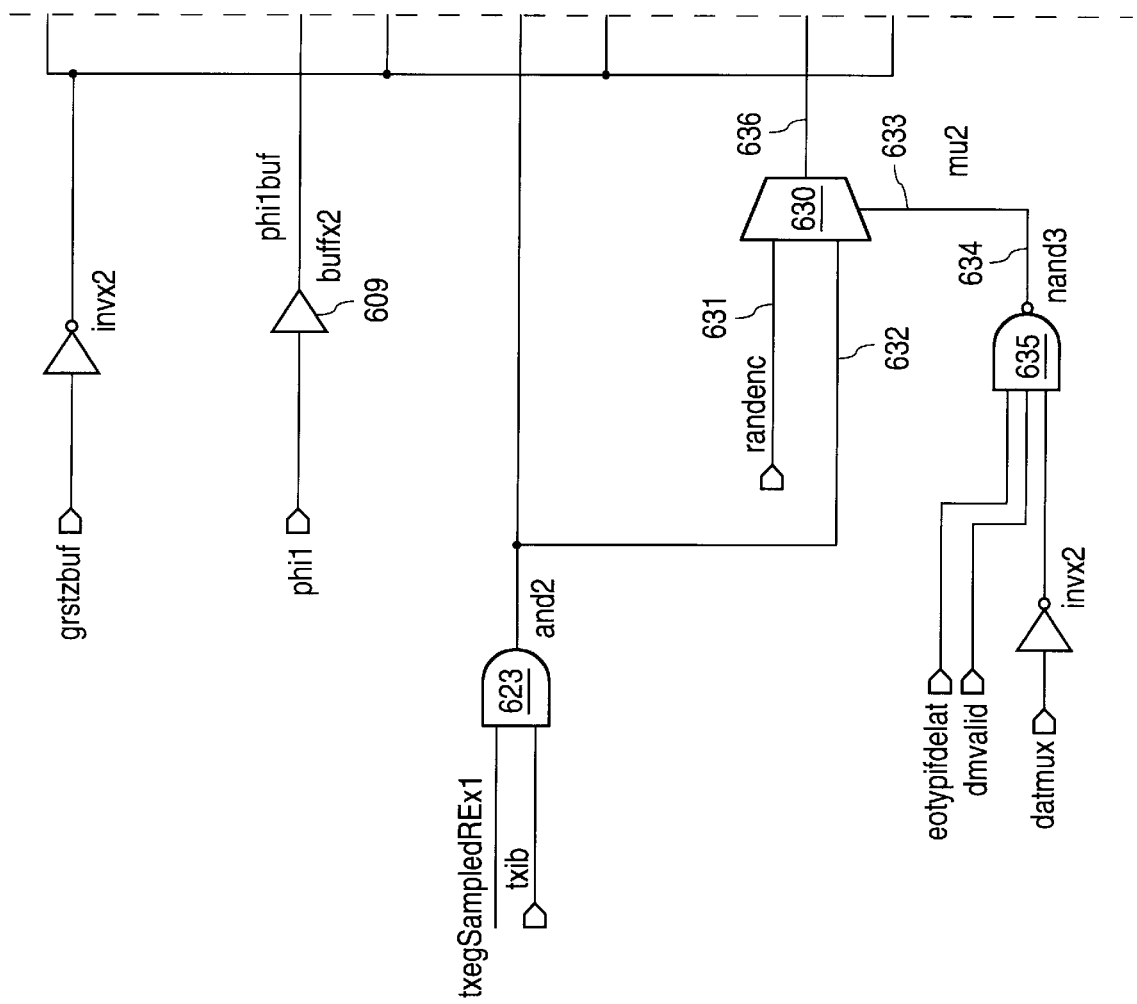
FIGS. 6, 6A, and 6B show a schematic diagram of one embodiment of the EOP/idle generator of data generation circuit depicted in FIG. 4 related to generating the random.
Figure 6:
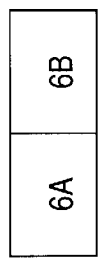
Figure 6B:
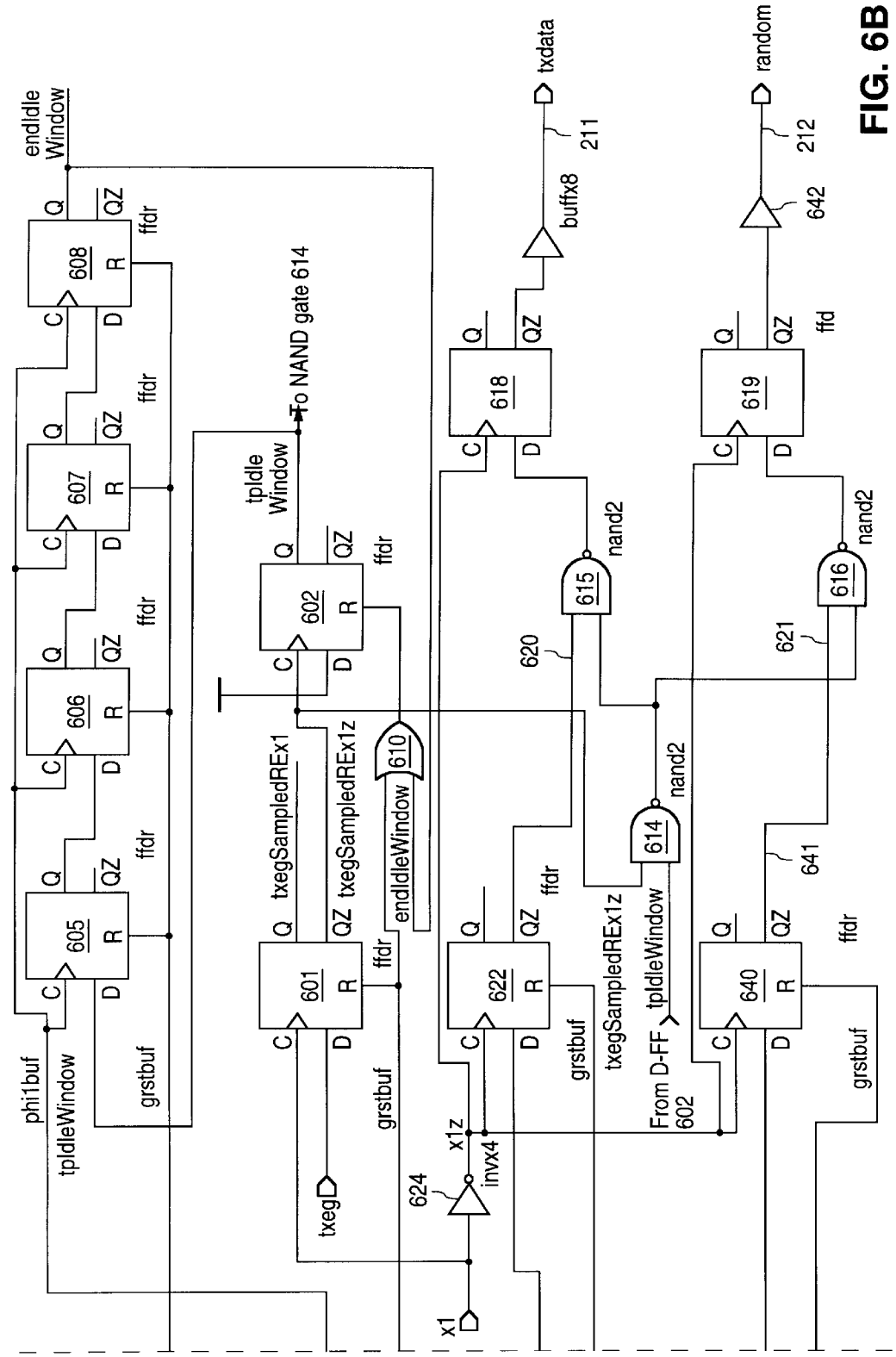

FIGS. 6, 6A, and 6B show a schematic diagram of one embodiment of EOP/idle generator 423 and multiplexer circuits 420 and 421 (FIG. 4). EOP/idle generator 423 includes D flip flop 601 having its D input node coupled to receive the txeg signal. D flip flop 601 is clocked by signal x1 having a frequency of 20 MHz, which is received from TCC 110 (FIG. 1). Thus, D flip flop "samples" the txeg signal and outputs on its Q output lead the logic level of the sample as txegSampledREx1, and the complement txegSampledREx1z on its QZ output lead.

A D flip flop 602 has its clock input node coupled to the QZ output lead of D flip flop 601, thereby being clocked by the txegSampledREx1z signal. The D input node of D flip flop 602 is coupled to the supply voltage source. Consequently, D flip flop 602 asserts the idle window signal ("tpidleWindow") outputted on its Q output lead at approximately the time the txeg signal is deasserted, thereby indicating the start of an "idle window" at the end of the packet of transmit data.

A D flip flop 605 has its D input node connected to receive the tpidleWindow signal from D flip flop 602, which is coupled to D flip flops 606–608 to form a delay circuit. D flip flops 605–608 are clocked by the 10 MHz phi1 signal via a buffer circuit 606, which receives the phi1 signal from TCC 110 (FIG. 1). Thus, the tpidleWindow signal delayed by D flip flops 605–608. Accordingly, D flip flop 608, at its Q output lead, provides an endidleWindow signal that is equivalent to the tpidleWindow signal delayed by approximately 320 ns. The endidleWindow signal then resets D flip flop 602 through an OR gate 610. Thus, the idle window is approximately 320 ns. The idle window is used in generating the EOP signal, which is a logic high level pulse with a pulse width of approximately 320 ns.

The tpidleWindow signal is also transmitted to an input lead of a two-input NAND gate 614. The other input lead of NAND gate 614 is coupled to receive the txegSampledREx1z signal. The txegSampledREx1z signal is at a logic high level substantially only during the period that the txeg signal is deasserted. As a result, NAND gate 614 outputs a logic low signal substantially only during the idle window at the end of a packet.

The output lead of NAND gate 614 is connected to an input lead of both NAND gate 615 and NAND gate 616. Thus, NAND gates 615 and 616 output logic high signals during the idle window. The output leads of NAND gates 615 and 616 are respectively connected to D flip flops 618 and 619. The clock nodes of D flip flops 618 and 619 are connected to the clock node of D flip flop 612 and, thus, are clocked by the complement of the x1 signal. Consequently, D flip flops 618 and 619 output a logic high signal on their QZ output leads during the idle window. Thus, a 320 ns logic high signal is transmitted on the txdata as random lines 211 and 212, respectively, thereby providing the EOP signal.

However, when not in the idle window, NAND gate 614 outputs a logic high signal, thereby causing NAND gates 615 and 616 to operate as inverters relative to the signals on their other input lead (i.e., input leads 620 and 621, respectively). NAND gates 615 receives the txib data on input lead 620 via a D flip flop 622 and an AND gate 623.

AND gate 623 receives the txegSampledREx1 signal and the txib signals at its input leads. Thus, AND gate 611 gates the txib signals to its output lead substantially only when the txeg signal is asserted.

D flip flop 622 receives the gated txib signals from AND gate 623. D flip flop 622 is clocked by the complement of the x1 signal via an inverter 624. Thus, D flip flop 622 is clocked a half cycle later than D flip flop 601, which generates the txegSampledREx1 signal. D flip flop 622 outputs the complement of the current txib signal on its QZ output lead during the next cycle of the x1 signal. As a result, the inverted txib data is transmitted to input lead 620 of NAND gate 615, which operates as an inverter when not in the idle window. The txib data is then clocked into D flip flop 618. D flip flop 618 then outputs the complement of the txib data on line 211 via a buffer, delayed by approximately one period of the x1 signal. After D flip flop 618 outputs the last txdata bit of the packet, NAND gate 614 causes D flip flop 618 to output the EOP signal as described above.

Data generation circuit 200 (FIG. 4) receives the randenc data signals from TCC 110 (FIG. 1) at multiplexer 630 via an input lead 631. Multiplexer 630 receives the txib data via input lead 632. A control lead 633 of multiplexer 630 is connected to an output lead 6334 of a three-input NAND gate 635. NAND gate 635 receives the eotyplf, dmvalid and datmux signals from TCC 110 (FIG. 1). MSM 112 (FIG. 1) provides the datmux signal. MSM 112 causes the datmux signal to be at a logic low level when the txib data being output from elasticity buffer 113 (FIG. 1) starts to become the data field.

The eotyplf signal is asserted after the destination address is transmitted. The dmvalid signal is asserted when the address filters 114 (FIG. 1) detects that there is at least one destination address authorized to receive the transmit data. The datmux signal is asserted while transmit data is available. Thus, NAND gate 635 outputs a logic low signal when these conditions occur, thereby selecting the randenc data signals. Otherwise, NAND gate 635 outputs a logic high signal, which causes multiplexer 630 to select the gated txib data from AND gate 623.

For example, in the case of a packet with at least one destination address authorized to receive the transmit data, at the start of a packet, the eotyplf signal is deasserted while the dmvalid and datmux signals are asserted. Consequently, NAND gate 630 outputs a logic high signal, thereby causing multiplexer 630 to select the txib data. Then, after TCC 110 provides the destination address, TCC 110 asserts the eotyplf signal, thereby causing NAND gate 636 to output a logic low signal. Thus, multiplexer 630 selects the randenc data to output on its output lead 636.

Output lead 636 of multiplexer 630 is connected to the D input node of a D flip flop 640. D flip flop 640 is clocked by the complement of the x1 signal via inverter 624. D flip flop 640 outputs the complement of the current randenc signal on its QZ output lead 641 during the next cycle of the x1 signal. Output lead 641 is connected to input lead 621 of NAND gate 616. As a result, the complemented randenc data is transmitted to input lead 621 of NAND gate 616, which operates as an inverter when not in the idle window. The randenc data is then clocked into D flip flop 619. D flip flop 619 then outputs the complement of the randenc data on line 212 via buffer 642, delayed by approximately one period of the x1 signal. After D flip flop 619 outputs the last randenc bit of the packet, NAND gate 614 causes D flip flop 619 to output the EOP signal as previously described. Accordingly, multiplexer 630 causes the txib data to be transmitted on random line 212 until the beginning of the data field. Then, multiplexer 630 causes the random data to be transmitted on random line 212. Thus, multiplexer 630 substantially eliminates switching noise on random line 212. The analog multiplexers for the unauthorized ports are controlled by their corresponding data select circuit to switch from txdata to random while the random line is carrying txdata (i.e., the destination address). Thus, lines 225 and 226 will have matched voltages when the analog multiplexer switches, thereby substantially eliminating switching noise.

Figure 7:
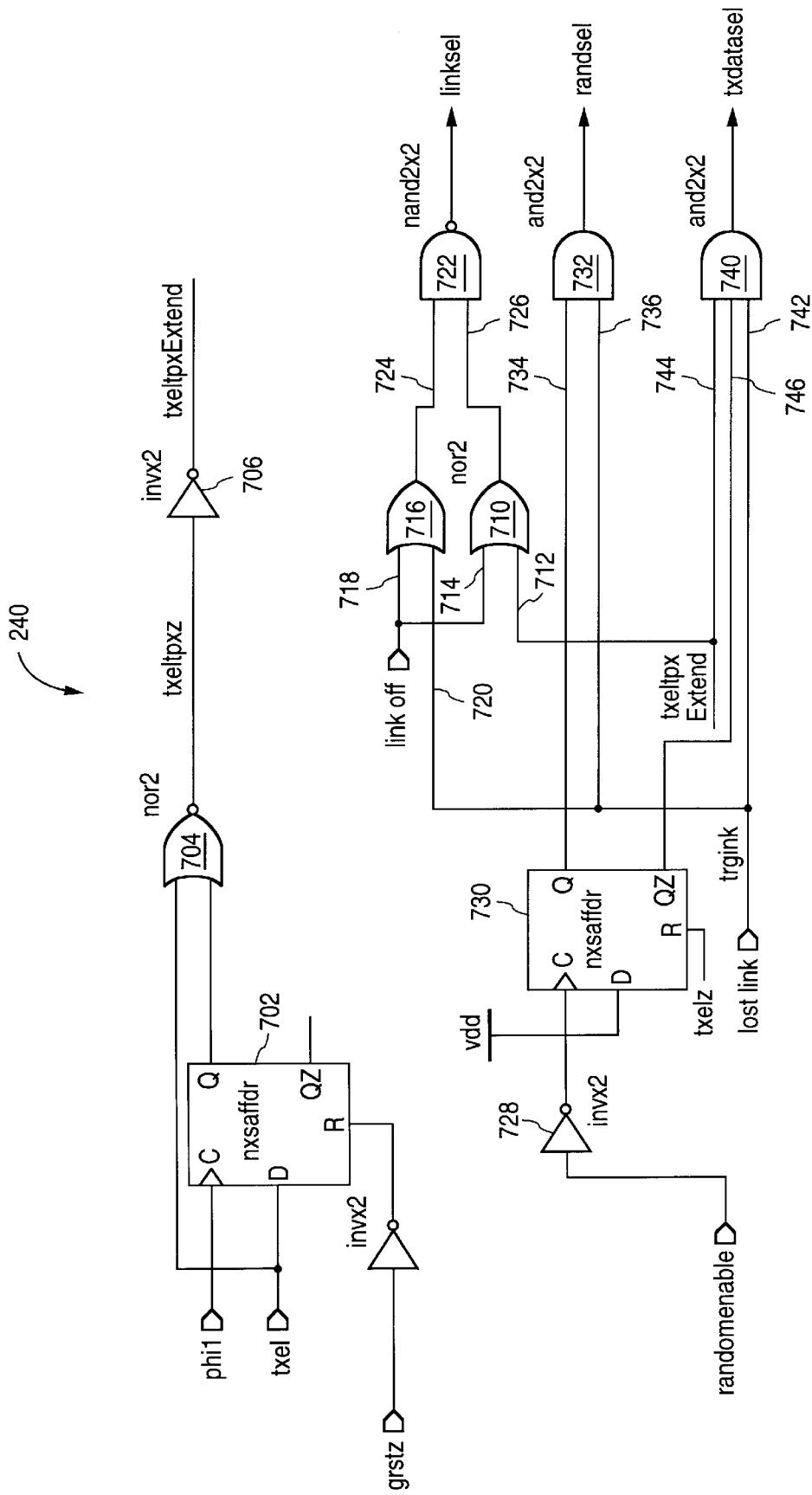
FIG. 7 show a schematic diagram of one embodiment of the data select circuit depicted in the transmit block in FIG. 3.

FIG. 7 shows a schematic diagram of one embodiment of data select circuit $240_1$ (FIG. 3). Of course, the schematic diagrams of data select circuits $240_2$–$240_{12}$ are substantially similar to that of data select circuit $240_1$.

The txel signal is extended by one period of the phi1 signal to generate the txelpxExtend signal via a D flip flop 702, a two-input NOR gate 704 and an inverter 706. D flip flop 702 receives the txel signal at its D input node and is clocked by the phi1 signal. NOR gate 704 has one input lead connected to the D input node of D flip flop 702, thereby receiving the txel signal. The other input lead of NOR gate 704 is coupled to the Q output lead of D flip flop 720. As a result, when the txel signal is asserted, NOR gate 704 outputs the a logic low signal (i.e., the complement of the txel signal). In addition, D flip flop 702 outputs the txel signal delayed by 1 period of the phi1 signal. Thus, after the txel signal is deasserted, NOR gate 704 continues to output a logic low signal for one period of the phi1 signal. The logic low signal outputted by NOR gate 704 is inverted by inverter 724 to generate the txelpxExtend signal. Accordingly, the txelpxExtent signal, when asserted, is substantially equivalent to the txel signal extended by one period of the phi1 signal.

The linksel signal is generated by a two-input OR gate 710, a two-input OR gate 716 and a two-input NAND gate 722. Or gate 710 is coupled to receive the txelpxExtend signal from inverter 708 via an input lead 712. OR gate 710 has another input lead 714 coupled to receive the link off signal from TCC 110 (FIG. 1). Thus, OR gate 710 outputs the logical OR of the txel signal and the link off signal.

OR gate 716 has an input lead 718 connected to input lead 714 of OR gate 710, thereby also receiving the link off signal. OR gate 716 has another input lead 720 coupled to receive the !lost link signal (i.e., the complement of the lost link signal) from TCC 110. Thus, OR gate 716 outputs the logical OR of the link off signal and the !lost link signal.

NAND gate 722 has input leads 724 and 726 connected to the output leads of OR gates 716 and 710, respectively. Accordingly, NAND gate 722 outputs the linksel signal substantially in accordance with logic equation 3 above. The output signal of NAND gate 722 (i.e., the linksel signal), is asserted under either of the following two conditions: (1) when link is lost with the corresponding port and the link off signal is not asserted; and (2) when at the same time, both the txel signal and the link off signal are not asserted.

The randsel signal is generated via an inverter 728, a D flip flop 730 and an AND gate 732. Inverter 728 is coupled to receive the !randenable signal (i.e., the complement of the randomenable signal) from TCC 110. The output lead of inverter 728 is connected to clock input node of D flip flop 730. The D input node of D flip flop 730 is connected to the supply voltage source, thereby receiving a substantially constant logic high signal. Thus, a logic high signal is clocked into D flip flop 730 when the randomenable signal is asserted. In addition, D flip flop has its reset lead coupled to the output lead of NOR gate 704, thereby receiving the complement of the extended txel signal. Thus, when the txel signal is not asserted, D flip flop 730 is reset, thereby implementing the logical AND of the txel signal and the randomenable signal on its Q output lead.

AND gate 732 has input leads 734 and 736 connected to the Q output lead of D flip flop 730 and to input lead 720 of OR gate 716, respectively. Thus, input lead 734 receives the logical AND of txel signal and the randomenable signal, whereas input lead 736 receives the !lost link signal. Accordingly, AND gate 732 outputs the randsel signal according logic equation 1 above. Thus, the randsel signal is asserted when the lost link signal is not asserted and the txel and randomenable signals are asserted.

The txdatasel signal is generated via inverter 728, D flip flop 730 and three-input AND gate 740. AND gate 740 has an input lead 742 connected to input lead 736 of AND gate 732, thereby receiving the !lost link signal. AND gate 740 also has an input lead 744 connected to input lead 712 of OR gate 710, thereby receiving the txelpxExtend signal. A third input lead 746 of AND gate 740 is connected to the QZ output lead of D flip flop 730. In normal operation, prior to transmitting data, RIC 100 (FIG. 1) is in idle. Thus, the txel signal is not asserted, thereby resetting D flip flop 730. Consequently, D flip flop outputs a logic high signal on its QZ output lead while in idle. If the randomenable signal remains deasserted when the txel signal is asserted, then D flip flop 730 does not clock, thereby continuing to output a logic high on its QZ output lead. Thus, input lead 746 of AND gate 740 receives the logical equivalent of a !randomenable signal. Accordingly, AND gate 740 outputs the txdatasel signal substantially in accordance with logic equation 2 above. Thus, the txdatasel signal is asserted when the lost link and randomenable signals are not asserted and the txel is asserted.

The foregoing has described the principles and various embodiments of the present invention. However, the invention should not be construed as being limited to the particular embodiments described. For example, different implementations of the data generation circuit, data select circuit, link generator, etc. may be used instead of the implementations described herein. Further, the two-tier switching method of the present invention can be used to reduce switching noise in any application that requires switching of analog signals. Thus, the above-described embodiments should be regarded as illustrative rather than restrictive. Variations can be made to those embodiments by workers skilled in the art without departing from the scope of the present invention as defined by the following claims.

I claim:

1. A method for use with a repeater for use in a local area network, said repeater having a transmit port, a first filter and a second filter, the method comprising:

receiving a first signal;

filtering said first signal using said first filter;

receiving a second signal;

filtering said second signal using said second filter;

providing said filtered first signal and said filtered second signal to a plurality of transmit ports, each transmit port of said plurality of transmit ports comprising a buffer driver coupled to a corresponding external interconnect, said plurality of transmit ports being part of said plurality of transmit ports;

independently selecting, for each transmit port of said plurality of transmit ports, either said filtered first signal or said filtered second signal; and outputting for each transmit port of said plurality of transmit ports, each said independently selected signal on said corresponding interconnect using said buffer driver of each transmit port.

2. The method of claim 1 wherein said plurality of transmit ports, said first filter and said second filter are part of an integrated circuit repeater interface controller.

3. The method of claim 2 further comprising:

receiving a third signal;

filtering said third signal using a third filter; and providing said filtered third signal to said plurality of transmit ports.

4. The method of claim 3 wherein:

said selecting step comprises independently selecting, for each transmit port of said plurality of transmit ports, either said filtered first signal, said filtered second signal or said filtered third signal.

5. The method of claim 4 wherein said first signal is a link signal, said second signal is a data signal and said third signal is a random data signal.

6. A circuit for use in an integrated circuit repeater interface controller, the circuit comprising:

a timing and control circuit;

a plurality of filters;

a data generation circuit coupled to said timing and control circuit and to said plurality of filters, said data generation circuit comprising a link generator coupled to a corresponding filter of said plurality of filters, wherein said link generator is configured to provide a link pulse between packets of transmit data, said link generator providing said link pulse outside of a window of time preceding the start of said packet and outside a window of time following the end of said packet;

a plurality of transmit ports coupled to said plurality of filters, each transmit port of said plurality of transmit ports being coupled to a corresponding external interconnect and to each filter of said plurality of filters, wherein said timing and control circuit is configured to provide a plurality of data signals and a plurality of control signals to said data generation circuit, said data generation circuit is configured to provide each data signal of said plurality of data signals to a corresponding filter of said plurality of filters, and each said transmit port of said plurality of transmit ports is configured to select one of said data signals filtered by said plurality of filters to transmit on said corresponding external interconnect.

7. A method comprising receiving a first signal;

filtering said first signal using a first filter;

receiving a second signal;

filtering said second signal using a second filter;

providing said filtered first signal and said filtered second signal to a transmit port, said transmit port comprising a buffer driver coupled to an external interconnect;

selecting said filtered second signal when said buffer driver is outputting said filtered first signal when a voltage of said filtered first signal is substantially equal to a voltage of said filtered second signal and not selecting said filtered second signal when said voltage of said filtered first signal is not substantially equal to said voltage of said filtered second signal;

outputting said filtered second signal on said external interconnect using said buffer driver; and causing a second path carrying said second signal to carry said first signal, whereby a first path carrying said first signal and said second path are both carrying said first signal.

8. The method of claim 7 wherein said selecting step occurs while said first and second paths are carrying said first signal.

9. The method of claim 8 further comprising causing said second path to carry said second signal during an idle period.

10. A circuit comprising:

a logic circuit;

a first filter having an input lead coupled to said logic circuit and having an output lead;

a second filter having an input lead coupled to said logic circuit and having an output lead;

a third filter having an input lead coupled to said logic circuit and having an output lead;

a first transmit port coupled to said logic circuit, said first transmit port having an output lead coupled to a first external interconnect, a first input lead coupled to said output lead of first filter, a second input lead coupled to said output lead of said second filter and a third input lead coupled to said output lead of said third filter, wherein said logic circuit is configured to cause said first transmit port to decouple said first external interconnect from said first filter and substantially concurrently coupled said first external interconnect to said second filter during predetermined periods when a voltage on said first input lead is substantially equal to a voltage on said second input lead and wherein said logic circuit is configured to cause said first transmit port to decouple said first external interconnect from said first filter and substantially concurrently couple said first external interconnect to said third filter during predetermined periods when a voltage on said first input lead is substantially equal to a voltage on said third input lead.

11. The circuit of claim 10 timber comprising a data generation circuit coupling said first, second and third filters to said logic circuit, wherein said data generation circuit is configured to provide a first signal to said first filter, a second signal to said second filter and a third signal to said third filter.

12. The circuit of claim 11 wherein said data generation circuit is capable of providing said second signal to said third filter during a period when said second signal is substantially identical to said third signal.

13. The circuit of claim 12 further comprising a second transmit port having an output lead coupled to a second external interconnect, a first input lead coupled to said output lead of said first filter, a second input lead coupled to said output lead of said second filter and a third input lead coupled to said output lead of said third filter.

14. The circuit of claim 13 wherein said first transmit port is capable of coupling said first external interconnect to said first filter while said second transmit port couples said second external interconnect to said second filter.

* * * * *